(12) United States Patent
Yajima et al.

(10) Patent No.: US 6,271,055 B1
(45) Date of Patent: *Aug. 7, 2001

(54) PROCESS FOR MANUFACTURING SEMICONDUCTOR ELEMENT USING NON-MONOCRYSTALLINE SEMICONDUCTOR LAYERS OF FIRST AND SECOND CONDUCTIVITY TYPES AND AMORPHOUS AND MICROCRYSTALLINE I-TYPE SEMICONDUCTOR LAYERS

(75) Inventors: Takahiro Yajima; Yasushi Fujioka, both of Kyoto; Shotaro Okabe, Nara; Masahiro Kanai, Kyoto; Hirokazu Ohtoshi, Nara; Akira Sakai; Tadashi Sawayama, both of Kyoto; Yuzo Kohda, Kyotanabe, all of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/038,708

(22) Filed: Mar. 9, 1998

(30) Foreign Application Priority Data

Mar. 10, 1997 (JP) .................................................... 9-054788

(51) Int. Cl.$^7$ .............................. H01L 21/00; H01L 31/00
(52) U.S. Cl. .............................. 438/97; 438/484; 136/258
(58) Field of Search .................................. 136/249, 258; 438/96, 97, 98, 484

(56) References Cited

U.S. PATENT DOCUMENTS 4,471,155 * 9/1984 Mohr et al. ........................ 136/258

(List continued on next page.)

FOREIGN PATENT DOCUMENTS 62-209871 9/1987 (JP) .

(List continued on next page.)

OTHER PUBLICATIONS

Patent Abstracts of Japan, vol. 012, No. 065 (E–586), Feb. 27, 1988.

(List continued on next page.)

*Primary Examiner*—Olik Chaudhuri
*Assistant Examiner*—William David Coleman
(74) *Attorney, Agent, or Firm*—Fitzpatrick, Cella, Harper & Scinto

(57) ABSTRACT

A process for forming a deposited film, a process for manufacturing a semiconductor element and a process for manufacturing a photoelectric conversion element are disclosed which each comprises a step of forming a first conductivity type semiconductor layer comprising a non-monocrystalline semiconductor on a substrate, a step of forming a substantially i-type semiconductor layer comprising an amorphous semiconductor on the first conductivity type semiconductor layer, a step of forming a substantially i-type semiconductor layer comprising a microcrystalline semiconductor on the substantially i-type semiconductor layer comprising the amorphous semiconductor while decreasing the film forming rate thereof and a step of forming a second conductivity type semiconductor layer comprising a non-monocrystalline semiconductor on the substantially i-type semiconductor layer comprising the microcrystalline semiconductor. Further, a process for forming a deposited film, a process for manufacturing a semiconductor element and a process for manufacturing a photoelectric conversion element are disclosed which each comprises a step of forming a first conductivity type semiconductor layer comprising a non-monocrystalline semiconductor on a substrate, a step of forming a substantially i-type semiconductor layer comprising an amorphous semiconductor on the first conductivity type semiconductor layer, a step of forming a substantially i-type semiconductor layer comprising a microcrystalline semiconductor on the substantially i-type semiconductor layer comprising the amorphous semiconductor and a step of forming a second conductivity type semiconductor layer comprising a non-monocrystalline semiconductor on the substantially i-type semiconductor layer comprising the microcrystalline semiconductor while increasing the film forming rate thereof. Thereby, a photoelectric conversion element having a high photoelectric conversion efficiency can be obtained with a high productivity.

38 Claims, 8 Drawing Sheets

U.S. PATENT DOCUMENTS

| | | | |
|---|---|---|---|
| 4,578,696 | 3/1986 | Ueno et al. | 357/59 |
| 5,439,533 * | 8/1995 | Saito et al. | 136/258 |
| 5,456,762 | 10/1995 | Kariya et al. | 136/258 |
| 5,571,749 * | 11/1996 | Matsuda et al. | 438/484 |
| 5,589,007 | 12/1996 | Fujioka et al. | 136/249 |
| 5,716,480 * | 2/1998 | Matsuyama et al. | 136/249 |

FOREIGN PATENT DOCUMENTS

| | | |
|---|---|---|
| 4-192414 | 7/1992 | (JP). |
| 4-266067 | 9/1992 | (JP). |

OTHER PUBLICATIONS

S. Miyazaki, et al., "Effects of Growth Rate on the Microcrystalline Characteristics of Plasma–Deposited $\mu c$—Si:H," *Solar Energy Materials 11*, (1984) pp. 85–95.

* cited by examiner

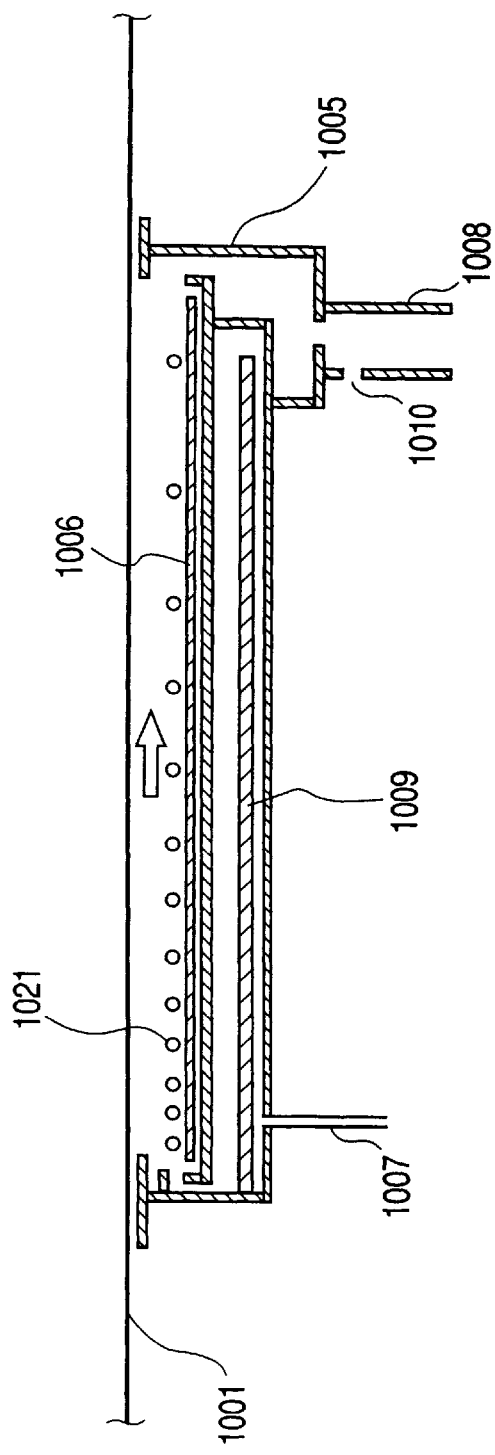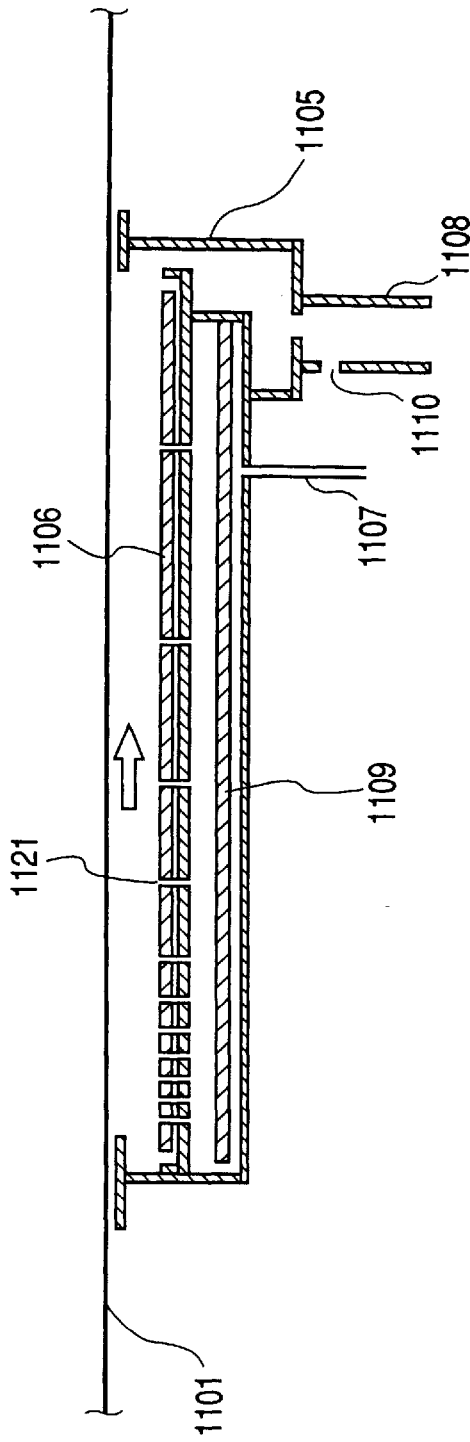

PROCESS FOR MANUFACTURING SEMICONDUCTOR ELEMENT USING NON-MONOCRYSTALLINE SEMICONDUCTOR LAYERS OF FIRST AND SECOND CONDUCTIVITY TYPES AND AMORPHOUS AND MICROCRYSTALLINE I-TYPE SEMICONDUCTOR LAYERS

BACKGROUND OF THE INVENTION

1. Field of the Invention

The present invention relates to a deposited film forming process, a deposited film forming apparatus, and a process for manufacturing a semiconductor element, and more particularly to a process for manufacturing a photoelectric conversion element with a semiconductor layer comprising microcrystals.

2. Related Background Art

As photoelectric conversion elements such as a photovoltaic element, sensor, or the like, there are known those in which a back face reflective layer made of a material such as ZnO or Ag is formed on a stainless steel substrate; a non-monocrystalline semiconductor film such as an amorphous silicon film having the pin or nip junction is formed thereon; and a transparent electrode of a material represented by ITO or $SnO_2$ is stacked thereon.

It is important for these photoelectric conversion elements comprised of a non-monocrystalline semiconductor to improve the photoelectric conversion efficiency. In a conventional amorphous silicon photoelectric conversion element, a high interface resistance between a light incident side electrode and a semiconductor layer of a specific conductivity type (p- or n-type semiconductor layer) hindered an improvement in the fill factor (F.F.), so that a significant improvement in the photoelectric conversion efficiency (Eff.) could not be attained. Thus, a microcrystalline semiconductor is employed to reduce the interface resistance between the light incident side electrode and the specific conductivity type semiconductor layer and an improvement in F.F. is achieved by the reduction of resistance due to the microcrystallization. Furthermore, the microcrystallization leads to an improvement in the light transmittance.

However, since an amorphous layer is generally formed by glow discharge decomposition of a mixed gas of $SiH_4$, $H_2$ and so on, and since in forming a specific conductivity type semiconductor layer comprised of microcrystals, the microcrystallization of silicon advances with a greater-high frequency power applied to glow discharge electrodes, the microcrystalline layer is formed with the high frequency power being more than several times greater than that when forming amorphous silicon. For this reason, there is a problem that when forming a microcrystalline layer, the i-type semiconductor layer surface, i.e., an interface between the i-type semiconductor layer and a p- or n-type semiconductor layer, is subjected to damage due to the collision of high-speed charged particles of the plasma generated by the glow discharge, whereby the junction of the i-type semiconductor layer and the p-or n-type semiconductor layer become imperfect, interface states increase and the photoelectric conversion efficiency decreases.

Thus, to solve this problem, Japanese Patent Application Laid-Open No. 62-209871 discloses a process of successively increasing the degree of microcrystallization of the i-type semiconductor layer toward the specific conductivity type semiconductor layer. This process includes a way to change the high frequency power or a way to change to the flow rate of $H_2$ for the successive change in the degree of microcrystallization as mentioned above. However, in the case of using a film forming chamber with a longitudinal discharge chamber as shown in FIG. 3 and continuously carrying a belt-shaped substrate as shown in FIG. 4 to form a semiconductor layer, the implementation of this process is difficult.

Therefore, it is considered to make a part of the i-type semiconductor layer of a microcrystalline layer. For microcrystallization, an increase in high frequency power and a rise in a $H_2$ dilution ratio may be employed. However, a rise in the $H_2$ dilution ratio leads to such considerably small film forming rates as 0.1–5 Å/sec, so that no microcrystalline i-type layer of a sufficient thickness can be obtained in a discharge chamber with a small length and it requires a long time to form a microcrystalline i-type layer of a sufficient thickness. This presents a problem for mass production.

When a way to reduce the $H_2$ dilution ratio or to increase a high frequency power is employed for increasing the film forming rate, the degree of microcrystallization in the outermost surface of a microcrystalline i-type semiconductor layer will decrease, thus increasing interface states at an interface with a specific conductivity type semiconductor layer formed on the i-type semiconductor layer (hereinafter, referred to as second conductivity type semiconductor layer). This poses a problem also where the second conductivity type semiconductor layer is amorphous.

Besides, when the second conductivity type semiconductor layer is formed of microcrystalline silicon, a high degree of microcrystallinity in the surface of the i-type layer and a low degree of microcrystallinity of the second conductivity type semiconductor layer stacked thereon would lead to an increase in the interface states of the p/i interface, thereby hindering an improvement in the photoelectric conversion efficiency. For increasing the degree of microcrystallization, an increase in high frequency power, a rise in a $H_2$ dilution ratio or the like can be adopted, but the film forming rate becomes small and accordingly a long time is necessary for the formation of a sufficiently thick second conductivity type semiconductor layer, thus requiring a very long discharge chamber for obtaining a sufficiently thick second conductivity type semiconductor layer. This has also presented a critical problem for the mass production of photovoltaic elements, as is the case with the microcrystalline i-type semiconductor layer as described above.

SUMMARY OF THE INVENTION

The present invention provides a process for manufacturing a microcrystalline i-type semiconductor layer, improved in the film forming rate without decreasing the degree of microcrystallization.

Such a microcrystalline i-type semiconductor layer improves the interface junction with a specific conductivity type layer joined with the i-type semiconductor layer. Besides, when the specific conductivity type semiconductor layer joined with the i-type semiconductor layer is a microcrystalline semiconductor, the damage to the i-type layer accompanying the formation of the specific conductivity type microcrystalline semiconductor layer is suppressed.

Besides, the present invention provides a process for manufacturing a microcrystalline specific conductivity type semiconductor layer, improved in the film forming rate without decreasing the degree of microcrystallization.

Such a microcrystalline specific conductivity type semiconductor layer improves the interface junction with an electrode in contact with the specific conductivity type semiconductor layer. Besides, the light transmittance is improved, thereby improving the FF of a photovoltaic element.

The present invention provides a process for forming a deposited film, a process for manufacturing a semiconductor element and a process for manufacturing a photoelectric conversion element, each comprising:
a step of forming a first conductivity type semiconductor layer comprising a non-monocrystalline semiconductor on a substrate; a step of forming a substantially i-type semiconductor layer comprising an amorphous semiconductor on the first conductivity type semiconductor layer; a step of forming a substantially i-type semiconductor layer comprising a microcrystalline semiconductor on the substantially i-type semiconductor layer comprising the amorphous semiconductor while decreasing the film forming rate thereof; and a step of forming a second conductivity type semiconductor layer comprising a non-monocrystalline semiconductor on the substantially i-type semiconductor layer comprising the microcrystalline semiconductor.

Besides, the present invention provides a process for forming a deposited film, a process for manufacturing a semiconductor element and a process for manufacturing a photoelectric conversion element, each comprising: a step of forming a first conductivity type semiconductor layer comprising a non-monocrystalline semiconductor on a substrate; a step of forming a substantially i-type semiconductor layer comprising an amorphous semiconductor on the first conductivity type semiconductor layer; a step of forming a substantially i-type semiconductor layer comprising a microcrystalline semiconductor on the substantially i-type semiconductor layer comprising the amorphous semiconductor; and a step of forming a second conductivity type semiconductor layer comprising a non-monocrystalline semiconductor on the substantially i-type semiconductor layer comprising the microcrystalline semiconductor while increasing the film forming rate thereof.

Furthermore, the present invention provides a process for forming a deposited film, a process for manufacturing a semiconductor element and a process for manufacturing a photoelectric conversion element, each comprising: a step of forming a first conductivity type semiconductor layer comprising a non-monocrystalline semiconductor on a substrate; a step of forming a substantially i-type semiconductor layer comprising an amorphous semiconductor on the first conductivity type semiconductor layer; a step of forming a substantially i-type semiconductor layer comprising a microcrystalline semiconductor on the substantially i-type semiconductor layer comprising the amorphous semiconductor while decreasing the film forming rate thereof; and a step of forming a second conductivity type semiconductor layer comprising a non-monocrystalline semiconductor on the substantially i-type semiconductor layer comprising the microcrystalline semiconductor while increasing the film forming rate thereof.

Additionally, the present invention provides a deposited film forming apparatus for decomposing a raw material gas by a glow discharge to form a deposited film on a substrate of a large length, comprising a plurality of raw material gas supply ports for supplying the raw material gas, wherein the raw material gas supply ports are provided in the apparatus such that the intervals between the raw material gas supply ports vary in the longitudinal direction of the substrate.

BRIEF DESCRIPTION OF THE DRAWINGS

FIG. 10 is a schematic sectional view showing yet another example of a film forming chamber according to the present invention;

FIG. 11 is a schematic sectional view showing still another example of a film forming chamber according to the present invention.

DETAILED DESCRIPTION OF THE PREFERRED EMBODIMENTS

Figure 1:
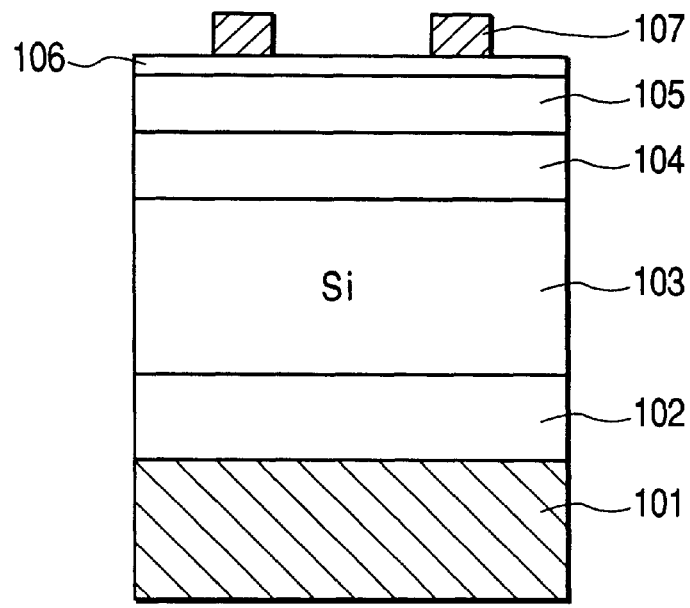
FIG. 1 is a schematic sectional outline view showing one example of a photoelectric conversion device manufactured by the production process according to the present invention.
Figure 2A:
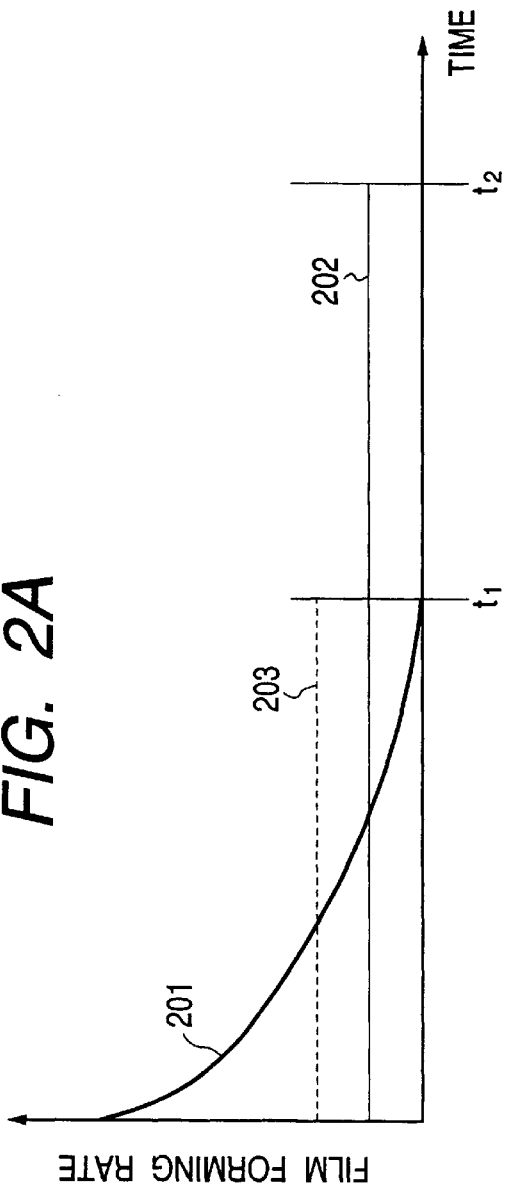
FIG. 2A is a graph schematically showing examples of the relation between the forming time of a microcrystalline i-type semiconductor layer and the film forming rate thereof and FIG. 2B is a graph schematically showing examples of the relation between the forming time of a second conductivity type semiconductor layer and the film forming rate thereof.

Hereinafter, referring to FIGS. 1 and 2A, the present invention will be described in detail. FIG. 1 is a schematic sectional view of a photoelectric conversion element formed by the manufacturing process according to the present invention. FIG. 2A is a relational graph between the forming time and the forming rate when forming an i-type microcrystalline semiconductor layer in the present invention.

On a substrate 101, a first conductivity type semiconductor layer 102, an amorphous i-type semiconductor layer 103, a microcrystalline i-type semiconductor layer 104, a second conductivity type semiconductor layer 105, a light transmitting or non-light-transmitting conductive film (electrode) 106 and a current collecting electrode 107 are stacked. The first and the second conductivity type semiconductor layers may be n-type and p-type semiconductor layers, respectively, or vice versa.

The second conductivity type semiconductor layer preferably comprises a microcrystalline semiconductor. Thereby, the light transmittance is improved and the interface resistance with the light incident side electrode 106 can be reduced, thus enabling an improvement in FF.

The term "substantially i-type semiconductor layer" as used in the specification and claims shall mean that the layer may be of substantially the i-type, in other words that the layer may contain an impurity such as a dopant within such a range that the i-type semiconductor characteristics of the layer is not impaired.

Microcrystalline i-type Semiconductor Layer

In the present invention, the film forming rate of the microcrystalline i-type semiconductor layer 104 formed between the amorphous i-type semiconductor layer 103 and the second conductivity type semiconductor layer 105 is set to a high film forming speed at the initial stage and made to successively decrease with the lapse of time, as shown in the curve 201 of FIG. 2A. In other words, from the amorphous i-type semiconductor layer to the second conductivity type semiconductor layer, the film forming rate is decreased in succession from a high film forming rate to a low film forming rate to thereby form a film.

Silicon atoms are randomly arranged on the surface of the amorphous i-type semiconductor layer 103, so that at the initial stage of film formation of the microcrystalline i-type semiconductor layer 104, microcrystals are relatively liable to be formed independently of the film forming rate. However, with a further progress of formation of the microcrystalline i-type semiconductor layer, it becomes hard to maintain the crystallinity with the high film forming rate being kept as shown by the dashed line 203 of FIG. 2A, whereby forming a microcrystalline semiconductor layer of a high quality becomes difficult.

On the other hand, when as shown by the line 202 of FIG. 2A the i-type microcrystalline semiconductor layer is formed at a low film forming rate from the initial film forming stage till the time when a sufficient thickness is obtained, an i-type microcrystalline semiconductor layer of high crystallinity and high quality can be obtained, which however requires a long time and is not suited to mass production.

Thus, when the film forming rate is successively dicreased with the progress of formation of the microcrystalline semiconductor layer as shown by the line 201 of FIG. 2A, a high quality microcrystalline semiconductor layer can be obtained with a high crystallinity maintained even for so short a time as to permit mass production, and it becomes possible to prevent a lowering in photoelectric conversion efficiency due to a lowering in the film quality of the i-type microcrystalline semiconductor layer 104, an increase of the interface states between the second conductivity type semiconductor layer 105 and the i-type microcrystalline semiconductor layer, or the like.

Microcrystalline Specific Conductivity Type Layer

Figure 2B:
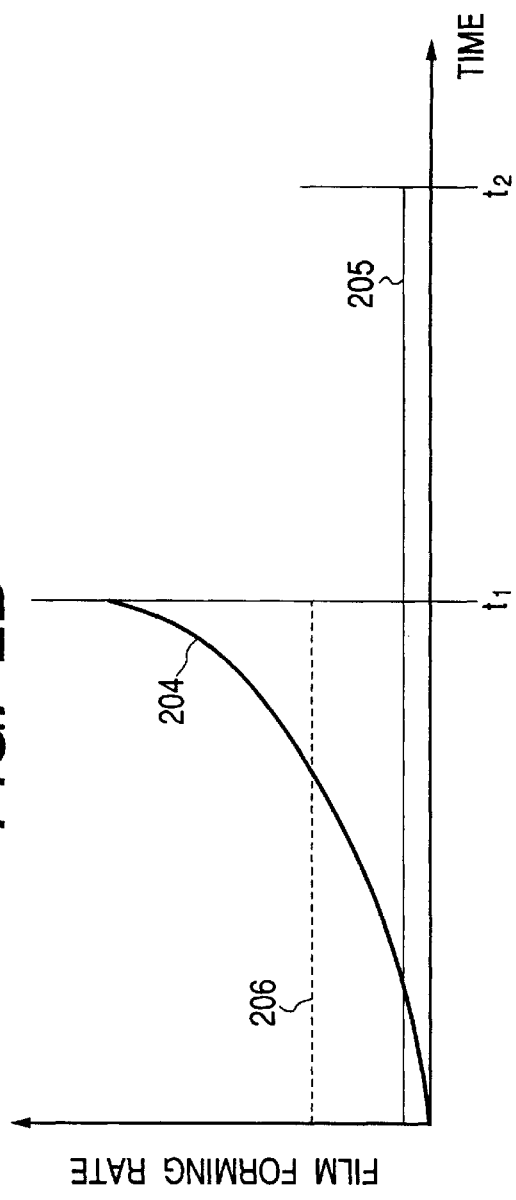

In the present invention, as shown by the line 204 of FIG. 2B, the film forming rate of the second conductivity type semiconductor layer formed on the microcrystalline i-type semiconductor layer is set to low at the initial film forming stage and made to increase in succession with the lapse of time. In other words, beginning with the interface between the microcrystalline i-type semiconductor layer 104 and the second conductivity type semiconductor layer 105, the film forming rate of the second conductivity type semiconductor layer 105 is increased in succession from a low film forming rate to a high film forming rate to thereby form a film.

When the second conductivity type semiconductor layer is formed with a high film forming rate from the initial film forming stage till the film forming completion stage as shown by the line 206 of FIG. 2B, the second conductivity type semiconductor layer can be formed even for so short a time as to permit mass production, with the result that at the interface between the microcrystalline i-type semiconductor layer 104 and the second conductivity type semiconductor layer 105, microcrystals are difficult to grow and interface states will increase.

The reason is that silicon atoms are partially arranged in order on the surface of the microcrystalline i-type semiconductor layer 104, so that when the initial film forming stage of the second conductivity type semiconductor layer 105 is carried out at a high film forming rate, microcrystals are difficult to form.

On the other hand, when the second conductivity type semiconductor layer is formed with the film forming rate kept low as shown by the line 205 of FIG. 2B, a microcrystalline semiconductor layer with high crystallinity and high quality is obtained, which however requires a long time and is not suited to mass production.

Thus, when the film forming rate is increased in succession with the progress of formation of the second conductivity type semiconductor layer as shown by the line 204 of FIG. 2B, the second conductivity type semiconductor layer is obtained with an increase in interface states between the microcrystalline i-type semiconductor layer 104 and the second conductivity type semiconductor layer 105 suppressed even for so short a time as to permit mass production, with the result that decreased photoelectric conversion efficiency due to increase of the interface states can be prevented. Besides, the microcrystallization of the second conductivity type semiconductor layer improves the junction with the electrode 106 as well as the light transmittance, thus raising the FF of photovoltaic elements.

In the present invention, when increasing the film forming rate from a low film forming rate to a high film forming rate, it is desirable that the increasing rate of the film forming rate increases in succession. In other words, by setting the film forming rate low at the initial forming stage of the second conductivity type semiconductor layer and then increasing it acceleratingly, the forming time of the second conductivity type semiconductor layer is shortened while suppressing an increase in the interface state at the interface with the micro-crystalline i-type semiconductor layer.

Besides, the thickness of the portion in which the film forming rate changes preferably occupies as large a portion of the layer as possible so long as it is within the range where the layer can be formed to attain mass production.

Besides, the ratio Rmax/Rmin of the maximum film forming rate Rmax to the minimum film forming rate Rmin of the portion in which the film forming rate changes is desirably as large as possible only if it is within the range where the layer can be formed preferably for such a forming time as to attain mass production.

Method for Controlling Film Forming Rate

Forming semiconductor layers is made by the plasma CVD process. Controlling the film forming rate of a microcrystalline i-type semiconductor layer and/or a microcrystalline p-type semiconductor layer is made preferably by controlling the supply amount of a raw material gas. Controlling the supply rate of a raw material gas enables the film forming rate to be kept high while retaining the microcrystallinity. In the case of a batch treatment or a process in which the carrying of a substrate of a large length is stopped and a film is formed at that state, the supply amount of a raw material gas is decreased or increased with the lapse of time. On the other hand, in the case of forming a film while carrying a large length substrate, a raw material gas is spatially decreased or increased in the carrying direction of the large length substrate. Even if the supply rate of the raw material gas is kept constant, the gas is utilized for diffusion or deposited film formation to spatially form a concentration gradient. Further, the supply amount of a raw material gas may be spatially decreased or increased in the carrying direction of a substrate.

EXAMPLES

Example 1

Using a high frequency plasma CVD apparatus (not shown) of a general diode parallel plate capacitive coupled system, the photoelectric conversion element shown in FIG. 1 was fabricated as follows.

On a substrate (size: 50 mm×100 mm) 101 made of stainless steel, an n-type semiconductor layer 102, an amorphous i-type semiconductor layer 103, a microcrystalline i-type semiconductor layer (p/i buffer layer) 104 and a p-type semiconductor layer 105 are formed in sequence under the conditions of Table 1.

The change of the film forming rate depending on the elapsed time of the p/i buffer layer 104 is shown as a schematic view in FIG. 2A. In Example 1, by decreasing the flow rate of $SiH_4$ from the maximum to the minimum shown in Table 1, the film forming rate is allowed to change in the shape of the curve 201.

TABLE 1

| Semi-conductor Layer | 102 | 103 | 104 | 105 |
|---|---|---|---|---|
| Kind and Thickness of Formed Semi-conductor Layer | n-type amorphous silicon 20 nm | i-type amorphous silicon 100 nm | i-type microcrystalline silicon 10 nm | p-type microcrystalline silicon 10 nm |
| Deposition Time (sec) | 70 | 320 | 30 | 50 |
| Raw Material Gas and Flow Rate (sccm) | $SiH_4$: 70 $PH_3$: 0.7 $H_2$: 350 | $SiH_4$: 70 $H_2$: 500 | $SiH_4$: 1–15 $H_2$: 1000 | $SiH_4$: 5 $BF_3$: 0.7 $H_2$: 500 |
| Film Forming Chamber Internal Pressure (Pa) | 130 | 130 | 130 | 130 |
| Substrate Temperature (20 C.) | 300 | 250 | 250 | 200 |
| Discharge Power (W) | 100 | 120 | 400 | 120 |

The substrate on which all the semiconductor layers are stacked was cut by an area of 50 cm², and fifty transparent conductive layers of 87 nm in thickness and 0.25 cm² in area, made of ITO ($In_2O_3+SnO_2$) films by the vacuum deposition method were formed as upper electrodes to prepare 50 small area cells (hereinafter, referred to as SC-1).

These cells were irradiated with an artificial solar light of AM 1.5 (100 mW/cm²) to evaluate the photoelectric conversion characteristics.

Comparative Example 1-1

Besides, for comparison, under the conditions of the smallest flow rate of $SiH_4$, i.e., 1 sccm of $SiH_4$, of the film forming conditions shown in Table 1 and with the film forming time (deposition time) adjusted so that the thickness amounts to the same thickness as with Example 1, a p/i buffer layer 104 was formed while keeping the film forming rate constant as shown by the shape of the line 202 in FIG. 2A. By following the procedure for SC-1 except for the above, 50 small area cells (hereinafter, referred to as SC-2) were prepared and measurements were carried out as with Example 1.

Comparative Example 1-2

Furthermore, for comparison, at the same film forming time as with SC-1 and with the flow rate 8 sccm of $SiH_4$ adjusted so that the thickness amounts to the same thickness as with SC-1, a p/i buffer layer 104 was formed while keeping the film forming rate constant like the shape of the line 203 in FIG. 2A. By following the procedure for the SC-1 except for the above, 50 small area cells (hereinafter, referred to as SC-3) were prepared and measurements were carried out as with Example 1.

Table 2 shows these evaluated results. In Table 2, Eff., Voc, Jsc and F.F. represent the photoelectric conversion efficiency, open circuit voltage, short circuit current density and fill factor, respectively. In all the examples including this example, the measured results are averaged values over all of the cells. It could be confirmed that SC-1 provided a good photoelectric conversion efficiency equivalent to that of SC-2 although a p/i buffer layer was formed for a short film forming time. Besides, the photoelectric conversion efficiency of SC-3 normalized in terms of the value for SC-2 was 0.96 and it could be confirmed that the photoelectric conversion efficiency lowered in the case of SC-3 where a p/i buffer layer was formed for a short film forming time while keeping the film forming rate constant.

TABLE 2

|  | Eff. (%) | Voc (V) | Jsc (mA/cm²) | F.F. | Film Forming Time (sec) |
|---|---|---|---|---|---|
| SC-1 | 7.20 | 0.970 | 10.20 | 0.727 | 30 |
| SC-2 | 7.22 | 0.972 | 10.15 | 0.732 | 200 |
| SC-3 | 6.93 | 0.969 | 10.22 | 0.700 | 30 |

Example 2

Figure 4:
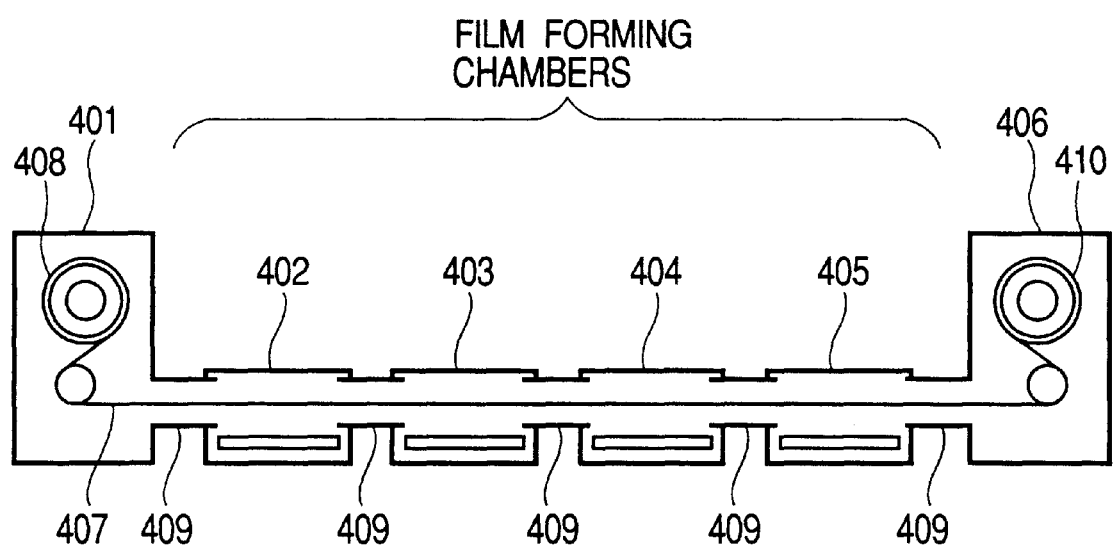
FIG. 4 is a schematic sectional view showing one example of an apparatus for continuously fabricating a photoelectric conversion element according to the present invention.

This example is identical with Example 1 in the layer structure of a photoelectric conversion element and differs from Example 1 in using an apparatus of the roll-to-roll system capable of continuously stacking semiconductor films on a belt-like substrate such as shown in FIG. 4. In the following, a description is made according to the order of the fabrication procedure.

(1) As the substrate 101, a belt-like stainless steel plate (12 cm wide×200 m long×0.15 mm thick) made of SUS430BA was employed. On the surface of this belt-like substrate, an about 1 μm ZnO transparent conductive layer was stacked by sputtering to form a belt-like substrate having a minute, uneven surface.

(2) The substrate prepared in (1) above was set in the delivery chamber 401 for a belt-like substrate in the state of being wound around a bobbin 408.

(3) The belt-like substrate was passed via the respective gas gates 409 through the film forming chambers 402–405, delivered to the winding chamber 406 for the belt-like substrate and applied with such a tension as not to loosen the substrate. After setting the belt-like substrate, all the chambers 401–406 were exhausted to vacuum.

(4) He gas was introduced while effecting the vacuum exhaustion and the interior of the respective film forming chambers was heated to about 350° C. in the atmosphere of He of about 200 Pa to be baked.

(5) After the baking by heating, 500 sccm of $H_2$ was introduced into each gas gate 409 as the gate gas, the respective raw material gases were introduced into individual film forming chambers 402–405 at predetermined flow rates and the internal pressure of each chamber was set to a predetermined pressure.

(6) The winding bobbin 410 in the belt-like substrate winding chamber 406 was rotated to move continuously the belt-like substrate 407 in a direction extending from the film forming chamber 402 to the film forming chamber 405 at a constant speed of 120 cm/min. Besides, by a temperature control device (not shown) provided in all the individual film forming chambers 402–405, a temperature control was made so as to keep the moving belt-like substrate at a predetermined temperature in the film forming space of each film forming chamber.

(7) After the temperature of the belt-like substrate was stabilized, a 13.56 MHz high frequency power was applied from the parallel plate electrodes to each of the film forming chambers 402–405 via a matching apparatus from a power source (not shown). By applying the discharge power, the raw material gas in each of the film forming chambers 402–405 was made into plasma to form semiconductor films on the surface of the continuously moving belt-like substrate 407 in the individual film forming chambers.

Figure 3:
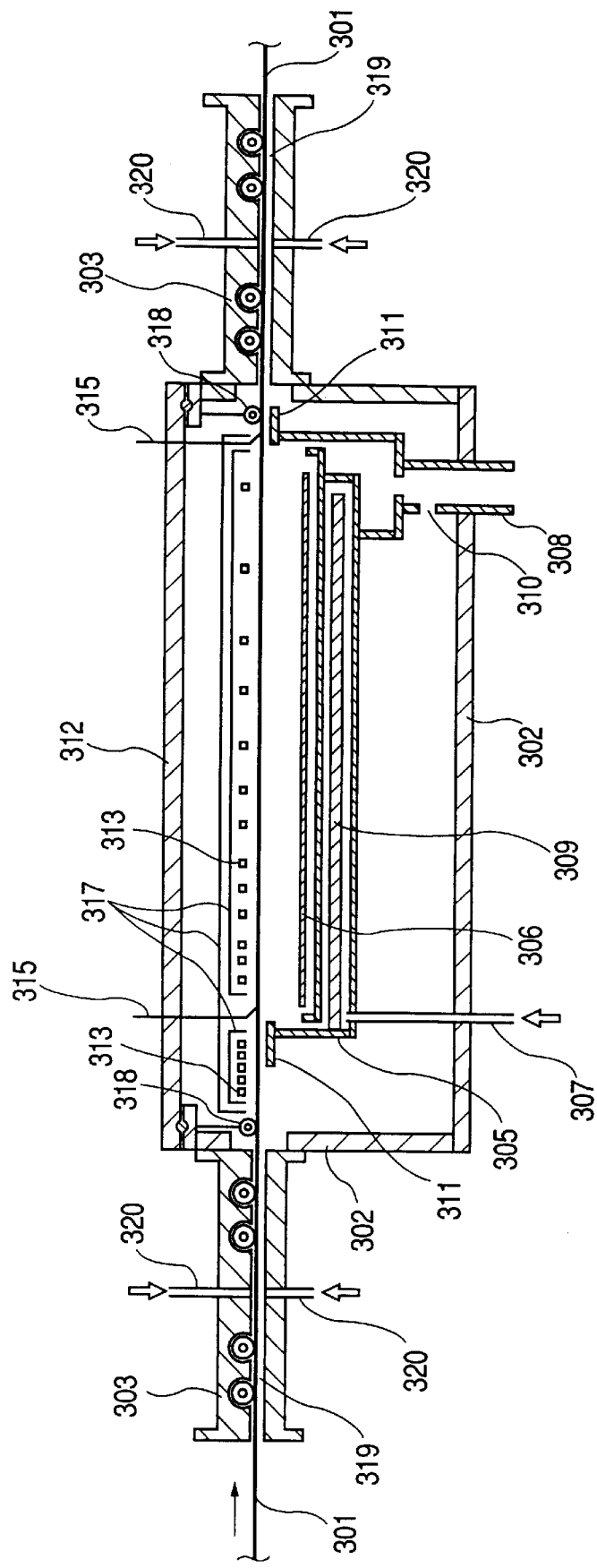
FIG. 3 is a schematic sectional view showing one example of a film forming chamber according to the present invention.

Incidentally, the film forming chambers 402–405 each have a structure as shown in FIG. 3, wherein a raw material gas is supplied through a gas supply pipe 307 upstream of a belt-like substrate 301 continuously moving in a chamber 302 having a closure 312 and exhausted from an exhaust port 310 downstream of the substrate carrying direction through an exhaust pipe 308. The respective film forming chambers were mutually isolated with gas gates 303. The gate gas is introduced into the separating route 319 from gate gas introducing pipes 320 in the gas gate. The temperature of the substrate 301 is monitored with thermocouples 315 and controlled with heaters 313. The substrate is supported by rollers 318. The raw material gas is supplied upstream of the substrate while being warmed by a heater 309. In a discharge chamber 305, a discharge electrode 306 for making the raw material gas into plasma is provided, where Numerals 311 and 317 denote a film forming region opening adjusting plate and a reflector. In the respective film forming chambers, an n-type semiconductor layer, an amorphous i-type semiconductor layer, a microcrystalline i-type semiconductor layer (p/i buffer layer) and a p-type semiconductor layer were formed in sequence under the conditions of Table 3.

TABLE 3

| Film Forming Chamber | 402 | 403 | 404 | 405 |
|---|---|---|---|---|
| Kind and Thickness of Formed Semi-conductor | n-type amorphous silicon 20 nm | i-type amorphous silicon 100 nm | i-type micro-crystalline silicon p/i buffer | p-type micro-crystalline silicon 10 nm |
| Length of Semi-conductor Forming Region (cm) | 70 | 100 | layer 10 nm 70 | 70 |
| Raw Material Gas and Flow Rate (sccm) | $SiH_4$: 150 $PH_3$: 6 $H_2$: 500 | $SiH_4$: 160 $H_2$: 500 | $SiH_4$: 10 $H_2$: 1000 | $SiH_4$: 10 $BF_3$: 0.1 $H_2$: 1000 |
| Film Forming Chamber Internal Pressure (Pa) | 130 | 140 | 140 | 130 |
| Belt-like Substrate Temperature (° C.) | 300 | 250 | 250 | 200 |
| Discharge Power (W) | 150 | 200 | 500 | 200 |

(8) The belt-like substrate was moved continuously for 180 minutes from the start of carrying. During the carrying, forming a semiconductor stacked film was performed continuously for 170 min.

(9) After the formation of the semiconductor stacked film over about 170 m, applying the discharge power, introducing the raw material gases and heating the belt-like substrate and film forming chamber were stopped and the inside of the film forming chambers was purged. Then, after the belt-like substrate and the interior of the apparatus was sufficiently cooled, the apparatus was opened and the belt-like substrate wound around the bobbin 410 was taken out from the substrate winding chamber 406 to the outside.

(10) By continuously processing the taken out belt-like substrate by a continuous module forming apparatus, a 70 nm thick ITO ($In_2O_3$+$SnO_2$) thin film was formed as a transparent electrode all over the semiconductor stacked film formed by the apparatus according to the present invention. Fine-wired Ag electrodes were formed at a definite interval as a current collecting electrode and module formation such as connection of unit elements into a series to continuously produce ten of 35 cm×35 cm solar cell modules (hereinafter, referred to as SC-4) composed of single solar cells. On the produced solar cell modules, an evaluation of characteristics was accomplished under irradiation of artificial solar rays of AM 1.5 (100 mW/cm²).

Apart from the above-mentioned film formation, in order to examine the film quality of an i-type microcrystalline semiconductor layer (p/i buffer layer), the carrying of a belt-like substrate was once stopped at the film forming chamber 404 and a film was formed under the film forming conditions for a p/i buffer layer as shown in Table 3.

Figure 5:
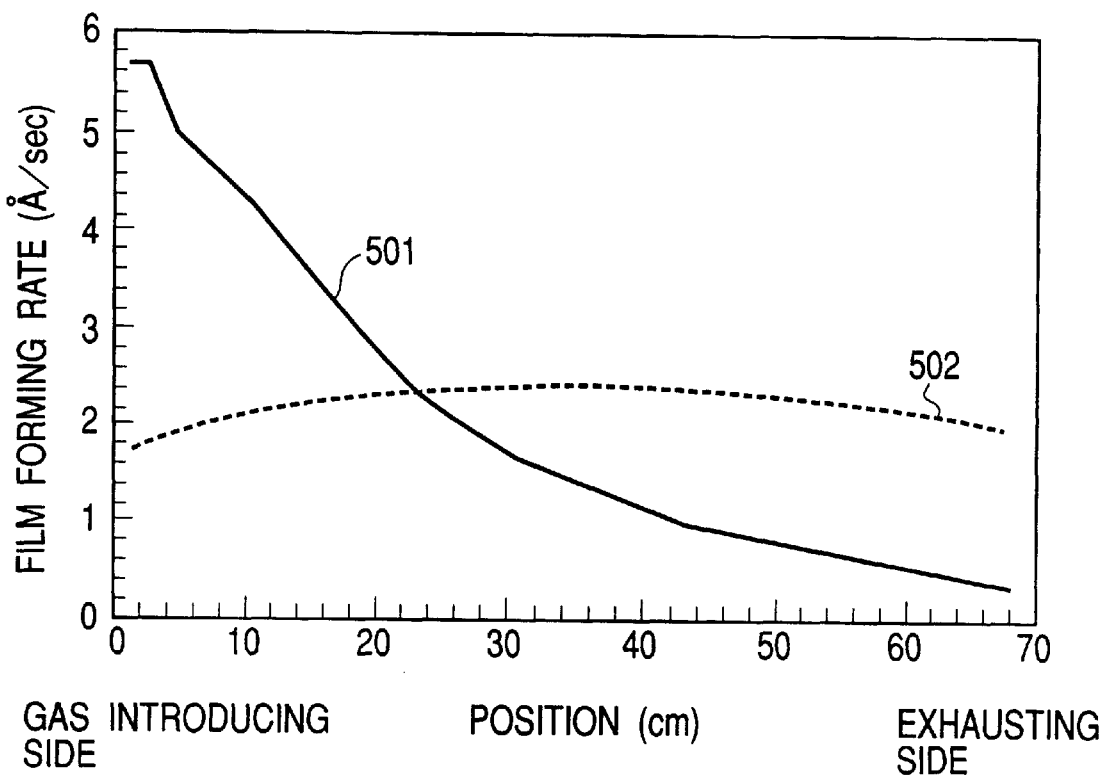
FIG. 5 is a graph showing one example of film forming rate distribution in a microcrystalline i-type semiconductor layer forming chamber according to the present invention.

The film forming rate was determined from the film thickness to examine the film forming rate distribution in the substrate carrying direction inside of the film forming chamber 404 and the examined results are shown by the line 501 of FIG. 5. FIG. 5 shows the relation between the position of the substrate in the carrying direction with the left end of the inside wall of the discharge chamber 305 in FIG. 3 being set to the origin and the film forming rate at that position. According to this, it is found that the film forming rate decreases toward the p-type layer. On the other hand, it was confirmed from the RHEED (Reflection High Energy Electron Diffraction) pattern that a good microcrystalline silicon was formed all over the film forming region.

Comparison Example 2

Besides, for comparison, to form a sufficiently thick i-type microcrystalline semiconductor layer at a constant film forming rate in forming the above p/i buffer layer 104 in the film forming chamber 404, a p/i buffer layer 104 was formed under the film forming conditions shown in Table 4. The film forming rate distribution in the film forming chamber 404 at that time is shown by the line 502 of FIG. 5. In a similar manner to that for SC-4 except for the above, ten of 35 cm×35 cm solar cell modules (hereinafter, referred to as SC-5) were produced to make measurements similar to those in Example 2.

Table 5 shows the average values of the evaluated results in these elements. The photoelectric conversion efficiency of SC-5 normalized in terms of the value for SC-4 is 0.96 and it can be confirmed that the photoelectric conversion efficiency decreases for SC-5 having a p/i buffer layer formed while keeping the film forming rate constant.

Under conditions to form microcrystalline silicon, i.e., under the conditions using a large high frequency power and a high $H_2$ dilution ratio, a raw material gas is rapidly decomposed near a gas blowout portion of the discharge chamber 305 by the large high frequency power and thickly deposited as a microcrystalline silicon film on the belt-like substrate 301 at a high film forming rate. Furthermore, the raw material gas not decomposed near the gas blowout portion moves in succession from the left to the right in the figure, decomposed while flowing toward the exhaust port 310 in the discharge chamber 305 and deposited as a microcrystalline silicon film on the belt-like substrate 301. However, since the raw material gas is successively used up, the thickness of the formed film gradually becomes thinner as the raw material gas travel. More specifically, the film forming rate is gradually reduced toward the exhaust port.

except that the amorphous i-type semiconductor layer 603 is formed of silicon germanium and an amorphous i-type semiconductor layer 604 (buffer layer 1) is further provided between the amorphous i-type semiconductor layer 603 and the microcrystalline i-type semiconductor layer 605 (buffer layer 2), the structure is similar to that of FIG. 1. That is, Numerals 601, 602 and 606 represent a substrate, a first conductivity type semiconductor layer, a second conductivity type semiconductor layer, respectively.

Figure 7:
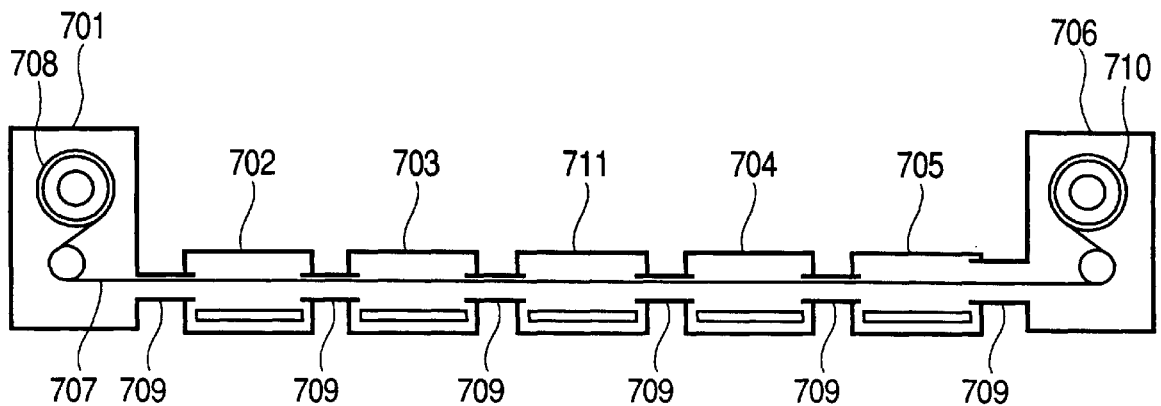
FIG. 7 is a schematic sectional view showing one example of an apparatus for continuously fabricating a photoelectric conversion element according to the present invention.

As a film forming apparatus of the roll-to-roll system capable of continuously stacking semiconductor films on the belt-like substrate, that shown in FIG. 7 was employed. In the following, a description is made according to the order of the fabrication procedure.

(1) As the substrate 601, a belt-like stainless steel plate (12 cm wide×200 m long×0.15 mm thick) made of SUS430BA was employed. On the surface of this belt-like substrate, a 400 nm thick reflective conductive layer of Ag was deposited by the DC sputtering and a 1 μm buffering layer of ZnO was further deposited thereon to form a belt-like substrate having a minute uneven surface. Thereafter, as with (2)–(10) of Example 2, film formation was carried out under the conditions of Table 6 to produce ten solar cell modules (hereinafter, referred to as SC-6).

TABLE 6

| Film Forming Chamber | 702 | 703 | 711 | 704 | 705 |
|---|---|---|---|---|---|
| Kind and Thickness of Formed Semiconductor Layer | n-type amorphous silicon 20 nm | i-type amorphous germanium 110 nm | i-type amorphous silicon 10 nm | i-type microcrystalline silicon 10 nm | p-type microcrystalline silicon 10 nm |
| Length of Semiconductor Forming | 70 | 100 | 70 | 70 | 70 |

TABLE 4

| Semiconductor Layer | Kind and Thickness of Formed Semiconductor Layer | Length of Semiconductor Forming Region | Raw Material Gas and Flow Rate (sccm) | | Film Forming Chamber Internal Pressure (Pa) | Belt-like Substrate Temperature (° C.) | Discharge Power (W) |
|---|---|---|---|---|---|---|---|
| | | | $SiH_4$ | $H_2$ | | | |
| 104 | i-type microcrystalline silicon 10 nm | 70 cm | 20 | 2000 | 140 | 250 | 500 |

TABLE 5

| | Eff. (%) | Voc (V) | Jsc (mA/cm²) | F.F. |
|---|---|---|---|---|
| SC-4 | 6.80 | 0.953 | 10.10 | 0.707 |
| SC-5 | 6.56 | 0.943 | 10.00 | 0.695 |

Example 3

Figure 6:
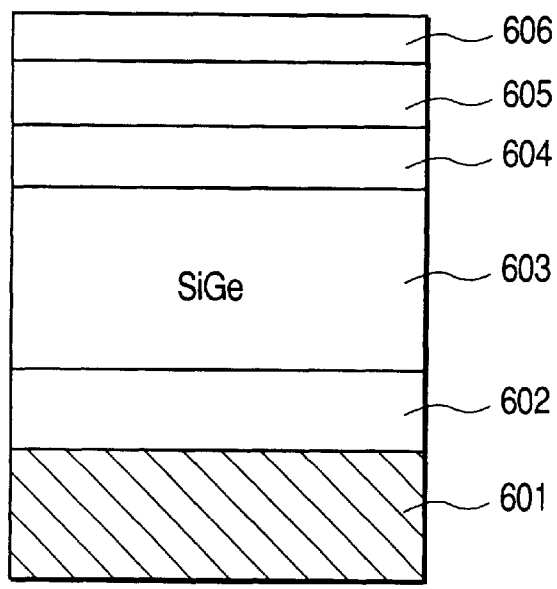
FIG. 6 is a schematic sectional outline view showing another example of a photoelectric conversion device manufactured according to the present invention.

In this example, photoelectric conversion elements of a layer structure as shown in FIG. 6 were formed. Specifically, TABLE 6-continued

| Film Forming Chamber | 702 | 703 | 711 | 704 | 705 |
|---|---|---|---|---|---|
| Region (cm) | | | | | |
| Raw Material Gas and Flow | $SiH_4$: 150 $PH_3$: 6 $H_2$: 500 | $SiH_4$: 100 $GeH_4$: 60 $H_2$: 500 | $SiH_4$: 30 $H_2$: 1000 | $SiH_4$: 10 $H_2$: 1000 | $SiH_4$: 10 $BF_3$: 2 $H_2$: 1000 |

TABLE 6-continued

| Film Forming Chamber | 702 | 703 | 711 | 704 | 705 |
|---|---|---|---|---|---|
| Rate (sccm) | | | | | |
| Film Forming Chamber Internal Pressure (Pa) | 130 | 140 | 140 | 140 | 130 |
| Belt-like Substrate Temperature (° C.) | 300 | 250 | 250 | 250 | 200 |
| Discharge Power (W) | 150 | 150 | 120 | 500 | 200 |

Comparison Example 3

For comparison, in order to form a sufficiently thick i-type microcrystalline semiconductor layer at a constant film forming rate in forming the p/i buffer layer 605 in the film forming chamber 704, a p/i buffer layer 605 was formed under the film forming conditions similar to those of Comparison Example 2, as shown in Table 4. The film forming rate distribution in the film forming chamber 704 at that time is shown by the dashed line 502 of FIG. 5. In a similar manner to that of SC-6 except for the above, ten of 35 cm×35 cm solar cell modules (hereinafter, referred to as SC-7) were produced to make measurements similar to those in Example 3.

Table 7 shows the average values of the evaluated results for these elements. The photoelectric conversion efficiency of SC-7 normalized in terms of the value of SC-6 is 0.96 and it can be confirmed that the photoelectric conversion efficiency decreases for SC-7 having a p/i buffer layer formed while keeping the film forming rate constant.

TABLE 7

|  | Eff. (%) | Voc (V) | Jsc (mA/cm²) | F.F. |
|---|---|---|---|---|
| SC-6 | 8.09 | 0.584 | 21.82 | 0.635 |
| SC-7 | 7.73 | 0.573 | 21.84 | 0.618 |

Example 4

Using a high frequency plasma CVD apparatus (not shown) of the general diode parallel plate capacitive coupled system, the photoelectric conversion element shown in FIG. 1 was fabricated as follows.

On a substrate (size: 50 mm×100 mm) 101 made of stainless steel, an n-type semiconductor layer 102, an amorphous i-type semiconductor layer 103, a microcrystalline i-type semiconductor layer (p/i buffer layer) 104 and a p-type semiconductor layer 105 were formed in sequence under the conditions of Table 8.

Time depending change of the film forming rate of the p-type semiconductor layer 105 is shown as a schematic view in FIG. 2B. In Example 4, by increasing the flow rate of $SiH_4$ and $BF_3$ from the minimum to the maximum shown in Table 8, the film forming rate is allowed to change in the shape of the line 204.

TABLE 8

| Semiconductor Layer | 102 | 103 | 104 | 105 |
|---|---|---|---|---|
| Kind and Thickness of Formed Semiconductor Layer | n-type amorphous silicon 20 nm | i-type amorphous silicon 100 nm | i-type microcrystalline silicon 10 nm | p-type microcrystalline silicon 10 nm |
| Deposition Time (sec) | 70 | 320 | 140 | 50 |
| Raw Material Gas and Flow Rate (sccm) | $SiH_4$: 70 $PH_3$: 0.7 $H_2$: 350 | $SiH_4$: 70 $H_2$: 500 | $SiH_4$: 1 $H_2$: 1000 | $SiH_4$: 2–20 $BF_3$: 0.1–1.0 $H_2$: 500 |
| Film Forming Chamber Internal Pressure (Pa) | 130 | 130 | 130 | 130 |
| Substrate Temperature (° C.) | 300 | 250 | 250 | 200 |
| Discharge Power (W) | 100 | 120 | 400 | 300 |

The substrate on which all the semiconductor layers was cut by an area of 50 cm² and fifty of transparent conductive layers of 87 nm in thickness and 0.25 cm² in area, made of ITO ($In_2O_3$+$SnO_2$) films by the vacuum deposition process were formed as the upper electrodes to produce fifty small area cells (hereinafter, referred to as SC-8).

These cells were irradiated with an artificial solar light of AM 1.5 (100 mW/cm²) to evaluate the photoelectric conversion characteristics.

Comparative Example 4-1

For comparison, under the conditions of the smallest flow rates of $SiH_4$ and $BF_3$ of the film forming conditions shown in Table 8 and with the film forming time adjusted so that the thickness amounts to the same thickness as with Example 4, a p-type semiconductor layer 105 was formed while keeping the film forming rate constant like the shape of the line 205 in FIG. 2B. By following the procedure for SC-8 except for the above, fifty small area cells (hereinafter, referred to as SC-9) were produced and measurements were carried out as with Example 4.

Comparative Example 4-2

Furthermore, for comparison, with the flow rate of 10 sccm for $SiH_4$ and 0.5 sccm for $BF_3$ adjusted so that the thickness amounts to the same thickness as with SC-8 at the same film forming time as with SC-8, the p-type semiconductor layer 105 was formed while keeping the film forming rate constant like the shape of the dashed line 206 in FIG. 2B. By following the procedure for SC-8 except for the above, fifty small area cells (hereinafter, referred to as SC-10) were produced and measurements were carried out as with Example 4.

Table 9 shows these evaluated results. It could be confirmed that SC-8 provided a good photoelectric conversion efficiency equivalent to that of SC-9 though the p-type semiconductor layer was formed for a short film forming time. Besides, the photoelectric conversion efficiency of SC-10 normalized in terms of the value of SC-9 was 0.96 and it could be confirmed that the photoelectric conversion efficiency lowered in the case of SC-10 where a p-type layer was formed for a short film forming time while keeping the film forming rate constant.

TABLE 9

|  | Eff. (%) | Voc (V) | Jsc (mA/cm$^2$) | F.F. | Film Forming Time (sec) |
|---|---|---|---|---|---|
| SC-8 | 7.45 | 0.982 | 10.29 | 0.738 | 50 |
| SC-9 | 7.45 | 0.976 | 10.27 | 0.743 | 250 |
| SC-10 | 7.09 | 0.967 | 10.22 | 0.717 | 50 |

Example 5

This example is identical with Example 4 in the layer constitution of a photoelectric conversion element and differs from Example 4 in using an apparatus of the roll-to-roll system capable of continuously stacking semiconductor films on a belt-like substrate shown in FIG. 4. As with Example 2, a film was formed under the conditions of Table 10 to produce ten solar cell modules (hereinafter, referred to as SC-11).

TABLE 10

| Film Forming Chamber | 402 | 403 | 404 | 405 |
|---|---|---|---|---|
| Kind and Thickness of Formed Semiconductor Layer | n-type amorphous silicon 20 nm | i-type amorphous silicon 100 nm | i-type microcrystalline silicon 10 nm | p-type microcrystalline silicon 10 nm |
| Length of Semiconductor Forming Region (cm) | 70 | 100 | 70 | 70 |
| Raw Material Gas and Flow Rate (sccm) | SiH$_4$: 150 PH$_3$: 6 H$_2$: 500 | SiH$_4$: 160 H$_2$: 500 | SiH$_4$: 10 H$_2$: 1000 | SiH$_4$: 10 BF$_3$: 0.1 H$_2$: 1000 |
| Film Forming Chamber Internal Pressure (Pa) | 130 | 140 | 140 | 130 |
| Belt-like Substrate Temperature (° C.) | 300 | 250 | 250 | 200 |
| Discharge Power (W) | 150 | 200 | 500 | 500 |

Figure 8:
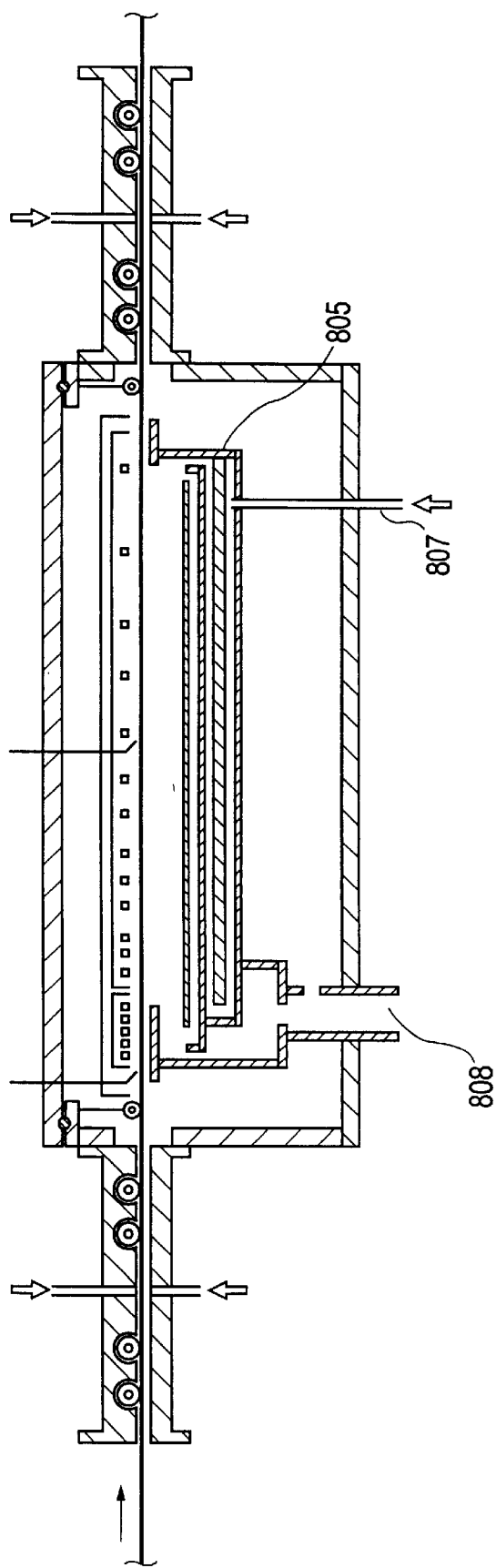
FIG. 8 is a schematic sectional view showing another example of a film forming chamber according to the present invention.

Incidentally, the film forming chambers 402–404 each have a structure as shown in FIG. 3, a raw material gas is supplied upstream of the continuously moving substrate and exhausted downstream of the substrate carrying direction through the exhaust pipe 308. The film forming chamber 405 has a structure as shown in FIG. 8, wherein a raw material gas is supplied from a gas supply pipe 807 downstream of the continuously moving belt-like substrate in a discharge chamber 805 and exhausted from upstream of the substrate carrying direction through an exhaust pipe 808.

The produced solar cell modules were irradiated with an artificial solar light of AM 1.5 (100 mW/cm$^2$) to evaluate the photoelectric conversion characteristics.

Apart from the above-mentioned film formation, in order to examine the film quality of a p-type semiconductor layer, the carrying of a belt-like substrate was once stopped and a film was formed for 40 minutes under the conditions for a p-type semiconductor layer shown in Table 10.

Figure 9:
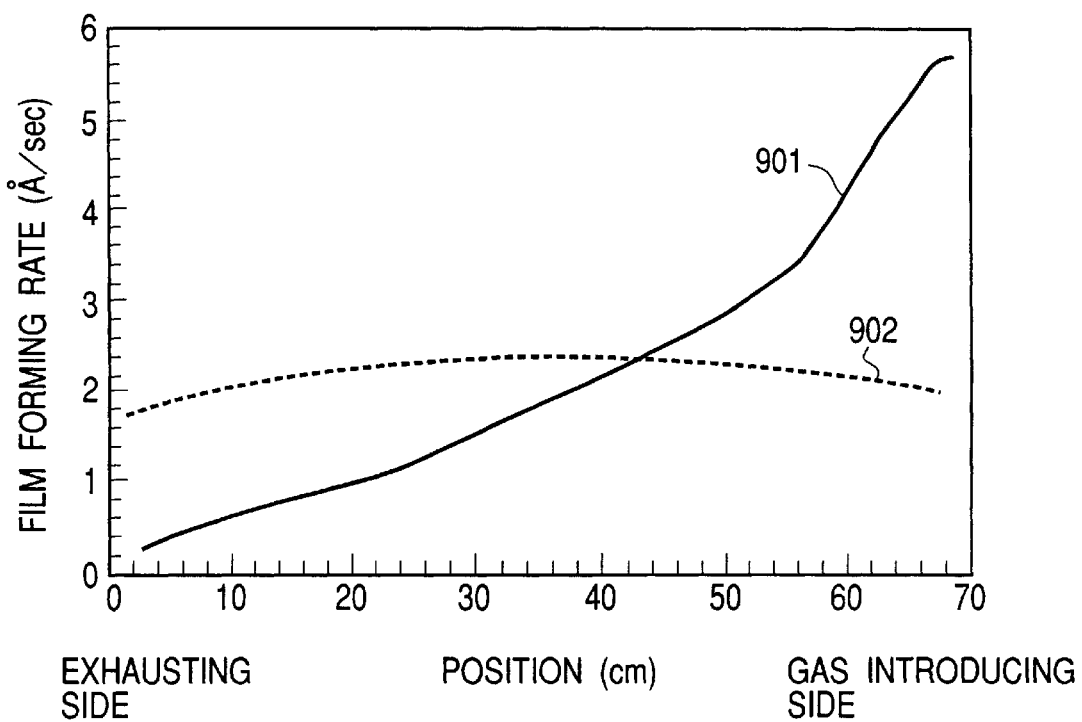
FIG. 9 is a graph showing one example of film forming rate distribution in a second conductivity type semiconductor layer forming chamber.

The film forming rate was determined from the film thickness to examine the film forming rate distribution in the substrate carrying direction inside of the film forming chamber 405 and the examined results are shown by the line 901 of FIG. 9. FIG. 9 represents the relation between the position of the substrate in the carrying direction with the left end of the inside wall of the discharge chamber 805 in FIG. 8 being set to the origin and the film forming rate at that position. According to this, it is found that the film forming rate increases toward downstream of the substrate carrying direction. On the other hand, it was confirmed from the RHEED pattern that a good microcrystalline silicon was formed all over the film forming region.

As with Example 2, under conditions capable of forming microcrystalline silicon, i.e., under the film forming condition of a large high frequency power and a high H$_2$ dilution ratio, a raw material gas is rapidly decomposed near the gas blowout portion of the discharge chamber 805 by a large high frequency power and thickly deposited as a microcrystalline silicon film on the belt-like substrate 801 at a high film forming rate. Furthermore, the raw material gas not decomposed near the gas blowout portion is moved in succession from the right to the left in the figure, decomposed while flowing toward the exhaust port in the discharge chamber 805 and deposited as a microcrystalline silicon film on the belt-like substrate 801. However, since the raw material gas is successively used up, the thickness of the formed film gradually becomes thinner as the raw material gas travels. That is, the film forming rate gradually decreases toward the exhaust hole.

Comparison Example 5

For comparison, in order to form a sufficiently thick p-type semiconductor layer at a constant film forming rate in forming the p-type semiconductor layer 105 in the film forming chamber 404, a p-type semiconductor layer 105 was formed under the film forming conditions shown in Table 11. The film forming rate distribution in the film forming chamber 404 at that time is shown by the dashed line 902 of FIG. 9. In a similar manner to that of SC-11 except for the above, ten of 35 cm×35 cm solar cell modules (hereinafter, referred to as SC-12) were produced to make measurements similar to those of Example 5.

Table 12 shows the average values of the evaluated results for these elements. The photoelectric conversion efficiency of SC-12 normalized in terms of the value of SC-11 is 0.96 and it can be confirmed that the photoelectric conversion efficiency decreases for SC-12 having a p-type semiconductor layer formed while keeping the film forming rate constant.

TABLE 11

| Semi-conductor Layer | Kind and Thickness of Formed Semi-conductor Layer | Length of Semi-conductor Forming Region | Raw Material Gas and Flow Rate (sccm) | | | Film Forming Chamber Internal Pressure (Pa) | Belt-like Substrate Temperature (° C.) | Discharge Power (W) |
|---|---|---|---|---|---|---|---|---|
| | | | SiH$_4$ | BF$_3$ | H$_2$ | | | |
| 105 | p-type micro-crystalline silicon 10 nm | 70 cm | 20 | 0.2 | 2000 | 130 | 200 | 500 |

TABLE 12

| | Eff. (%) | Voc (V) | Jsc (mA/cm$^2$) | F.F. |
|---|---|---|---|---|
| SC-11 | 7.14 | 0.973 | 10.10 | 0.727 |
| SC-12 | 6.86 | 0.968 | 10.08 | 0.703 |

Example 6

Except that the amorphous i-type semiconductor layer 103 was formed of silicon germanium, this example is similar to SC-11 in the layer constitution.

As with Example 2, using an apparatus of the roll-to-roll system capable of continuously stacking semiconductor layers on a belt-like substrate shown in FIG. 4, a film was formed under the conditions of Table 13 to produce ten solar cell modules (hereinafter, referred to as SC-13).

On the produced solar cell modules, evaluation of characteristics was carried out under irradiation of an artificial solar light of AM 1.5 (100 mW/cm$^2$).

TABLE 13

| Film Forming Chamber | 402 | 403 | 404 | 405 |
|---|---|---|---|---|
| Kind and Thickness of Formed Semi-conductor Layer | n-type amorphous silicon 20 nm | i-type amorphous silicon germanium 100 nm | i-type micro-crystalline silicon germanium 10 nm | p-type micro-Crystalline silicon 10 nm |
| Length of Semi-conductor Forming Region (cm) | 70 | 100 | 70 | 70 |
| Raw Material Gas and Flow Rate (sccm) | SiH$_4$: 150 PH$_3$: 6 H$_2$: 500 | SiH$_4$: 100 GeH$_4$: 60 H$_2$: 500 | SiH$_4$: 8 GeH$_4$: 2 H$_2$: 1000 | SiH$_4$: 10 BF$_3$: 0.1 H$_2$: 1000 |
| Film Forming Chamber Internal Pressure (Pa) | 130 | 140 | 140 | 130 |
| Belt-like Substrate | 300 | 250 | 250 | 200 |

TABLE 13-continued

| Film Forming Chamber | 402 | 403 | 404 | 405 |
|---|---|---|---|---|
| Temperature (° C.) | | | | |
| Discharge Power (W) | 150 | 200 | 500 | 500 |

Comparative Example 6

Besides, for comparison, in order to form a sufficiently thick p-type semiconductor layer at a constant film forming rate in forming the above p-type semiconductor layer 105, a p-type semiconductor layer 105 was formed under the film forming conditions similar to those of Comparative Example 5, shown in Table 11. The other points were made equal to those of Example 6. The film forming rate distribution in the film forming chamber 405 at that time is shown by the dashed line 902 of FIG. 9. In a similar manner to that of SC-13 except for the above, ten of 35 cm×35 cm solar cell modules (hereinafter, referred to as SC-14) were produced to make measurements similar to those of Example 5.

Table 14 shows the average values of the evaluated results for these elements. The photoelectric conversion efficiency of SC-14 normalized in terms of the value of SC-13 is 0.97 and it can be confirmed that the photoelectric conversion efficiency decreases for SC-14 having a p-type semiconductor layer formed while keeping the film forming rate constant.

TABLE 14

| | Eff. (%) | Voc (V) | Jsc (mA/cm$^2$) | F.F. |
|---|---|---|---|---|
| SC-13 | 8.39 | 0.597 | 21.89 | 0.642 |
| SC-14 | 8.12 | 0.586 | 21.89 | 0.633 |

Example 7

Figure 12:
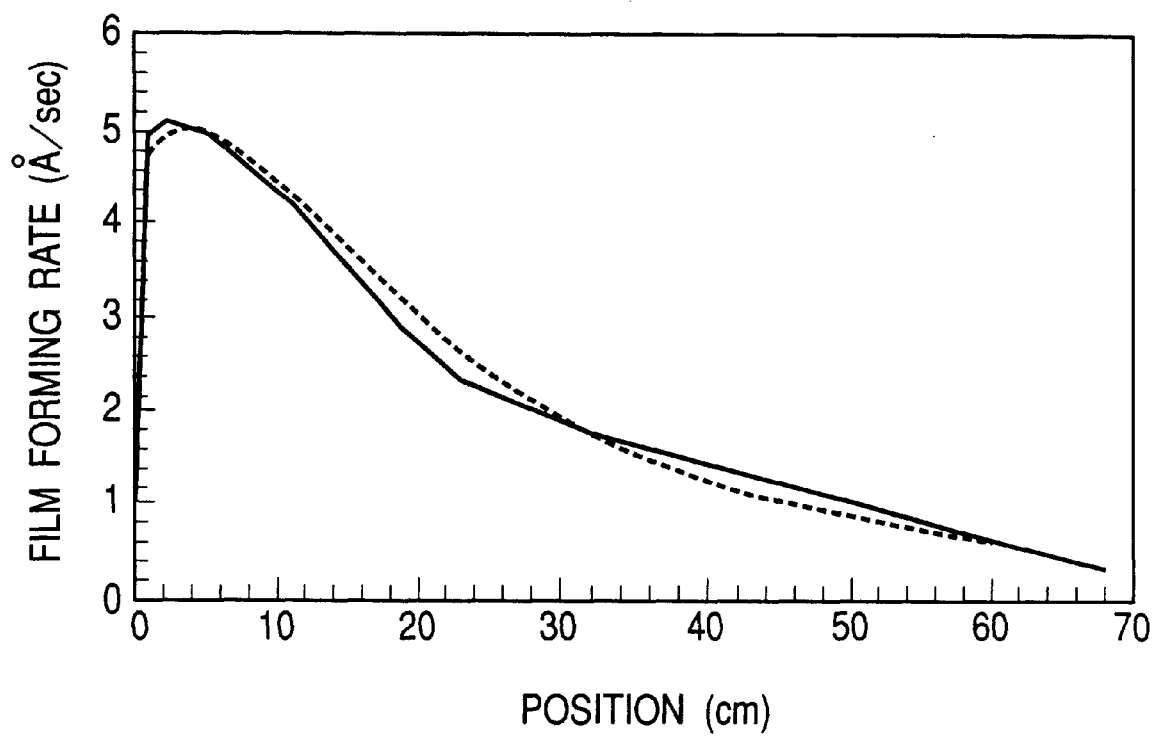
FIG. 12 is a graph showing a further example of film forming rate distribution in a film forming chamber according to the present invention.

To afford a distribution of film forming rate in forming the above p/i buffer layer 104 in the film forming chamber 404 for Example 2, a plurality of small holes 1021 for supplying a raw material gas were provided in the side wall of the discharge chamber 1005 as shown in FIG. 10, whereby a raw material gas was supplied. The raw material gas supplying small holes 1021 are so disposed that their number varies from a large density state at the upstream of the substrate carrying direction or on the side of the i-type semiconductor layer film forming chamber 403 to a small density state at the downstream of the substrate carrying direction, so that a film forming rate distribution employed in the manufacturing process according to the present invention as indicated by the line 201 of FIG. 2A is easily obtained. Under the film forming conditions as shown in Table 15, a p/i buffer layer 104 was formed. The film forming rate distribution in the film forming chamber 404 at that time is shown by the solid line of FIG. 12. In a similar manner to that of SC-4 except for the above, ten of 35 cm×35 cm solar cell modules (hereinafter, referred to as SC-15) were produced to make measurements similar to those in Example 2.

Table 16 shows the average values of the evaluated results in these elements. The photoelectric conversion efficiency of SC-15 normalized in terms of the value of SC-5 is 1.035 and it can be confirmed that the photoelectric conversion efficiency for SC-15 having a p/i buffer layer formed in a discharge chamber structure as shown in FIG. 10 was improved as compared with SC-5 having a p/i buffer layer formed while keeping the film forming rate constant in a conventional discharge chamber structure. Besides, the high frequency power could be made smaller than that of Example 2.

Incidentally, the reversed disposition of the raw material gas supplying small holes concerning the above mentioned dense-to-coarse sequence in this apparatus may be applied to the film forming of a microcrystalline p-type semiconductor layer also.

process according to the present invention as indicated by the line 201 of FIG. 2A is easily obtained. Under the film forming conditions as shown in Table 15, a p/i buffer layer 104 was formed. The film forming rate distribution in the film forming chamber 404 at that time is indicated by the dashed line of FIG. 12. In a similar manner to that of SC-4 except for the above, ten of 35 cm×35 cm solar cell modules (hereinafter, referred to as SC-16) were produced to make measurements similar to those of Example 2.

Table 16 shows the average values of the envaluated results for these elements. The photoelectric conversion efficiency of SC-16 normalized in terms of the value of SC-5 is 1.040 and it can be confirmed that the photoelectric conversion efficiency for SC-16 having a p/i buffer layer formed in a discharge chamber structure as shown in FIG. 11 was improved as compared with SC-5 having a p/i buffer layer formed while keeping the film forming rate constant in a conventional discharge chamber structure. Besides, as with Example 7, the high frequency power could be made smaller than that of Example 2.

According to the present invention, a microcrystalline i-type semiconductor layer to be provided between an amorphous i-type semiconductor layer and a second conductivity type semiconductor layer, and/or a second conductivity type semiconductor layer to be formed on a microcrystalline i-type semiconductor layer can be obtained at a sufficient film thickness while maintaining the crystallinity even for such a short time as to permit mass production, thus forming a photoelectric conversion element with a high photoelectric conversion efficiency retained.

TABLE 15

| Semi-conductor Layer | Kind and Thickness of Formed Semi-conductor Layer | Length of Semi-conductor Forming Region | Raw Material Gas and Flow Rate (sccm) | | Film Forming Chamber Internal Pressure (Pa) | Belt-like Substrate Temperature (° C.) | Discharge Power (W) |
|---|---|---|---|---|---|---|---|
| | | | SiH$_4$ | H$_2$ | | | |
| 104 | i-type micro-crystal-line silicon 10 nm | 70 cm | 10 | 1000 | 140 | 250 | 350 |

TABLE 16

| | Eff. (%) | Voc (V) | Jsc (mA/cm$^2$) | F.F. |
|---|---|---|---|---|
| SC-15 | 6.79 | 0.951 | 10.12 | 0.705 |
| SC-16 | 6.82 | 0.953 | 10.08 | 0.710 |
| SC-5 | 6.56 | 0.943 | 10.00 | 0.695 |

Example 8

As with Example 7, to afford a distribution of film forming rate in forming the above p/i buffer layer 104 in the film forming chamber 404 for Example 2, a plurality of small holes 1121 for supplying a raw material gas were provided in the discharge electrode 1106 of the discharge chamber 1105 as shown in FIG. 11 and a raw material gas was supplied. The raw material gas supplying small holes 1121 are so disposed that their number changes from a large density state at the upstream of the substrate carrying direction or on the side of the i-type semiconductor layer film forming chamber 403 to a small density state at the downstream of the substrate carrying direction, so that a film forming rate distribution employed in the manufacturing

What is claimed is:

1. A process for forming a deposited film comprising:
   a step of forming a first conductivity type semiconductor layer comprising a non-monocrystalline semiconductor on a substrate;
   a step of forming a substantially i-type semiconductor layer comprising an amorphous semiconductor on the first conductivity type semiconductor layer;
   a step of forming a substantially i-type semiconductor layer comprising a microcrystalline semiconductor on the substantially i-type semiconductor layer comprising the amorphous semiconductor while decreasing the film forming rate thereof; and
   a step of forming a second conductivity type semiconductor layer comprising a non-monocrystalline semiconductor on the substantially i-type semiconductor layer comprising the microcrystalline semiconductor.

2. The process as set forth in claim 1, wherein the substrate has a large length.

3. The process as set forth in claim 1, wherein the film forming rate is decreased by decreasing the supply rate of the raw material gas with the elapse of time.

4. The process as set forth in claim 1, wherein the semiconductor layers are successively formed while carrying the substrate.

5. The process as set forth in claim 4, wherein in the step of forming the substantially i-type semiconductor layer comprising the microcrystalline semiconductor, the film forming rate is decreased by spatially decreasing the amount of the raw material gas present in the film forming chamber in the substrate carrying direction.

6. The process as set forth in claim 1, wherein the decreasing rate of the film forming rate is gradually decreased.

7. A process for forming a deposited film comprising:
   a step of forming a first conductivity type semiconductor layer comprising a non-monocrystalline semiconductor on a substrate;
   a step of forming a substantially i-type semiconductor layer comprising an amorphous semiconductor on the first conductivity type semiconductor layer;
   a step of forming a substantially i-type semiconductor layer comprising a microcrystalline semiconductor on the substantially i-type semiconductor layer comprising the amorphous semiconductor; and
   a step of forming a second conductivity type semiconductor layer comprising a non-monocrystalline semiconductor on the substantially i-type semiconductor layer comprising the microcrystalline semiconductor while increasing the film forming rate thereof.

8. The process as set forth in claim 7, wherein the substrate has a large length.

9. The process as set forth in claim 7, wherein the film forming rate is increased by increasing the supply rate of the raw material gas with the elapse of time.

10. The process as set forth in claim 7, wherein the semiconductor layers are successively formed while carrying the substrate.

11. The process as set forth in claim 10, wherein in the step of forming the second conductivity type semiconductor layer comprising the non-monocrystalline semiconductor, the film forming rate is increased by spatially increasing the amount of the raw material gas present in the film forming chamber in the substrate carrying direction.

12. A process for manufacturing a semiconductor element comprising:
   a step of forming a first conductivity type semiconductor layer comprising a non-monocrystalline semiconductor on a substrate;
   a step of forming a substantially i-type semiconductor layer comprising an amorphous semiconductor on the first conductivity type semiconductor layer;
   a step of forming a substantially i-type semiconductor layer comprising a microcrystalline semiconductor on the substantially i-type semiconductor layer comprising the amorphous semiconductor while decreasing the film forming rate thereof; and
   a step of forming a second conductivity type semiconductor layer comprising a non-monocrystalline semiconductor on the substantially i-type semiconductor layer comprising the microcrystalline semiconductor.

13. The process as set forth in claim 12, wherein the substrate has a large length.

14. The process as set forth in claim 12, wherein the film forming rate is decreased by decreasing the supply rate of the raw material gas with the elapse of time.

15. The process as set forth in claim 12, wherein the semiconductor layers are successively formed while carrying the substrate.

16. The process as set forth in claim 15, wherein in the step of forming the substantially i-type semiconductor layer comprising the microcrystalline semiconductor, the film forming rate is decreased by spatially decreasing the amount of the raw material gas present in the film forming chamber in the substrate carrying direction.

17. The process as set forth in claim 12, wherein the decreasing rate of the film forming rate is gradually decreased.

18. A process for manufacturing a semiconductor element comprising:
   a step of forming a first conductivity type semiconductor layer comprising a non-monocrystalline semiconductor on a substrate;
   a step of forming a substantially i-type semiconductor layer comprising an amorphous semiconductor on the first conductivity type semiconductor layer;
   a step of forming a substantially i-type semiconductor layer comprising a microcrystalline semiconductor on the substantially i-type semiconductor layer comprising the amorphous semiconductor; and
   a step of forming a second conductivity type semiconductor layer comprising a non-monocrystalline semiconductor on the substantially i-type semiconductor layer comprising the microcrystalline semiconductor while increasing the film forming rate thereof.

19. The process as set forth in claim 18, wherein the substrate has a large length.

20. The process as set forth in claim 18, wherein the film forming rate is increased by increasing the supply rate of the raw material gas with the elapse of time.

21. The process as set forth in claim 18, wherein the semiconductor layers are successively formed while carrying the substrate.

22. The process as set forth in claim 21, wherein in the step of forming the second conductivity type semiconductor layer comprising the non-monocrystalline semiconductor, the film forming rate is increased by spatially increasing the amount of the raw material gas present in the film forming chamber in the substrate carrying direction.

23. A process for manufacturing a photoelectric conversion element comprising:
   a step of forming a first conductivity type semiconductor layer comprising a non-monocrystalline semiconductor on a substrate;
   a step of forming a substantially i-type semiconductor layer comprising an amorphous semiconductor on the first conductivity type semiconductor layer;
   a step of forming a substantially i-type semiconductor layer comprising a microcrystalline semiconductor on the substantially i-type semiconductor layer comprising the amorphous semiconductor while decreasing the film forming rate thereof; and
   a step of forming a second conductivity type semiconductor layer comprising a non-monocrystalline semiconductor on the substantially i-type semiconductor layer comprising the microcrystalline semiconductor.

24. The process as set forth in claim 23, wherein the substrate has a large length.

25. The process as set forth in claim 23, wherein the film forming rate is decreased by decreasing the supply rate of the raw material gas with the elapse of time.

26. The process as set forth in claim 23, wherein the semiconductor layers are successively formed while carrying the substrate.

27. The process as set forth in claim 26, wherein in the step of forming the substantially i-type semiconductor layer comprising the microcrystalline semiconductor, the film forming rate is decreased by spatially decreasing the amount of the raw material gas present in the film forming chamber in the substrate carrying direction.

28. The process as set forth in claim 23, wherein the decreasing rate of the film forming rate is gradually decreased.

29. A process for manufacturing a photoelectric conversion element comprising:
   a step of forming a first conductivity type semiconductor layer comprising a non-monocrystalline semiconductor on a substrate;
   a step of forming a substantially i-type semiconductor layer comprising an amorphous semiconductor on the first conductivity type semiconductor layer;
   a step of forming a substantially i-type semiconductor layer comprising a microcrystalline semiconductor on the substantially i-type semiconductor layer comprising the amorphous semiconductor; and
   a step of forming a second conductivity type semiconductor layer comprising a non-monocrystalline semiconductor on the substantially i-type semiconductor layer comprising the microcrystalline semiconductor while increasing the film forming rate thereof.

30. The process as set forth in claim 29, wherein the substrate has a large length.

31. The process as set forth in claim 29, wherein the film forming rate is increased by increasing the supply rate of the raw material gas with the elapse of time.

32. The process as set forth in claim 29, wherein the semiconductor layers are successively formed while carrying the substrate.

33. The process as set forth in claim 32, wherein in the step of forming the second conductivity type semiconductor layer comprising the non-monocrystalline semiconductor, the film forming rate is increased by spatially increasing the amount of the raw material gas present in the film forming chamber in the substrate carrying direction.

34. A deposited film forming apparatus for decomposing a raw material gas by a glow discharge to form a deposited film on a substrate of a large length, comprising:
   a discharge chamber; and
   a single gas supply for supplying a raw material gas to a plurality of raw material gas supply holes provided in the discharge chamber, wherein the raw material gas supply holes are provided so that the intervals between the adjacent raw material gas supply holes vary from each other in the longitudinal direction of the substrate.

35. A process for forming a deposited film comprising:
   a step of forming a first conductivity type semiconductor layer comprising a non-monocrystalline semiconductor on a substrate;
   a step of forming a substantially i-type semiconductor layer comprising an amorphous semiconductor on the first conductivity type semiconductor layer;
   a step of forming a substantially i-type semiconductor layer comprising a microcrystalline semiconductor on the substantially i-type semiconductor layer comprising the amorphous semiconductor while decreasing the film forming rate thereof; and
   a step of forming a second conductivity type semiconductor layer comprising a non-monocrystalline semiconductor on the substantially i-type semiconductor layer comprising the microcrystalline semiconductor while increasing the film forming rate thereof.

36. A process for manufacturing a semiconductor element comprising:
   a step of forming a first conductivity type semiconductor layer comprising a non-monocrystalline semiconductor on a substrate;
   a step of forming a substantially i-type semiconductor layer comprising an amorphous semiconductor on the first conductivity type semiconductor layer;
   a step of forming a substantially i-type semiconductor layer comprising a microcrystalline semiconductor on the substantially i-type semiconductor layer comprising the amorphous semiconductor while decreasing the film forming rate thereof; and
   a step of forming a second conductivity type semiconductor layer comprising a non-monocrystalline semiconductor on the substantially i-type semiconductor layer comprising the microcrystalline semiconductor while increasing the film forming rate thereof.

37. A process for manufacturing a photoelectric conversion element comprising:
   a step of forming a first conductivity type semiconductor layer comprising a non-monocrystalline semiconductor on a substrate;
   a step of forming a substantially i-type semiconductor layer comprising an amorphous semiconductor on the first conductivity type semiconductor layer;
   a step of forming a substantially i-type semiconductor layer comprising a microcrystalline semiconductor on the substantially i-type semiconductor layer comprising the amorphous semiconductor while decreasing the film forming rate thereof; and
   a step of forming a second conductivity type semiconductor layer comprising a non-monocrystalline semiconductor on the substantially i-type semiconductor layer comprising the microcrystalline semiconductor while increasing the film forming rate thereof.

38. The deposited film forming apparatus as set forth in claim 34, wherein the varied intervals between the adjacent raw material gas supply holes provide a film forming rate distribution.

* * * * *

UNITED STATES PATENT AND TRADEMARK OFFICE
CERTIFICATE OF CORRECTION

PATENT NO.   : 6,271,055 B1
DATED        : August 7, 2001
INVENTOR(S)  : Takahiro Yajima et al.

It is certified that error appears in the above-identified patent and that said Letters Patent is hereby corrected as shown below:

Column 1,
Line 48, "greater-high" should read -- greater high --; and
Line p-or, """ should read -- p- or --.

Column 3,
Line 8, "a step" should read -- ¶ a step --;
Line 24, "comprising: a step" should read -- comprising: ¶ a step --; and
Line 40, "comprising: a step" should read -- comprising: ¶ a step --.

Column 5,
Line 3, "is" should read -- are --; and
Line 37, "dicreased" should read -- decreased --.

Column 7,
Table 1, "(20 C.)" should read -- (°C.) --.

Column 9,
Line 4, "interior" should read -- interiors --; and
Line 5, "was" should read -- were --.

Colum 11,
Line 39, "travel." should read -- travels. --.

Column 17,
Table 13, "Crystalline" should read -- crystalline --.

UNITED STATES PATENT AND TRADEMARK OFFICE
CERTIFICATE OF CORRECTION

PATENT NO.    : 6,271,055 B1
DATED         : August 7, 2001
INVENTOR(S)   : Takahiro Yajima et al.

It is certified that error appears in the above-identified patent and that said Letters Patent is hereby corrected as shown below:

<u>Column 20,</u>
Line 10, "envaluated" should read -- evaluated --.

Signed and Sealed this

Thirteenth Day of August, 2002

Attest:

Attesting Officer

JAMES E. ROGAN
Director of the United States Patent and Trademark Office